(12) United States Patent
Kuo

(10) Patent No.: US 11,106,531 B2
(45) Date of Patent: Aug. 31, 2021

(54) FLASH MEMORY CONTROLLER, STORAGE DEVICE AND READING METHOD THEREOF

(71) Applicant: Silicon Motion, Inc., Jhubei (TW)

(72) Inventor: Shiuan-Hao Kuo, New Taipei (TW)

(73) Assignee: SILICON MOTION, INC., Jhubei (TW)

( * ) Notice: Subject to any disclaimer, the term of this patent is extended or adjusted under 35 U.S.C. 154(b) by 18 days.

(21) Appl. No.: 16/741,190

(22) Filed: Jan. 13, 2020

(65) Prior Publication Data
US 2021/0034456 A1 Feb. 4, 2021

(30) Foreign Application Priority Data
Jul. 29, 2019 (TW) ................... 108126704

(51) Int. Cl.
*G06F 11/00* (2006.01)
*G06F 11/10* (2006.01)
*G06F 3/06* (2006.01)
*H03M 13/11* (2006.01)

(52) U.S. Cl.
CPC ........ *G06F 11/1068* (2013.01); *G06F 3/0619* (2013.01); *G06F 3/0653* (2013.01); *G06F 3/0679* (2013.01); *H03M 13/1102* (2013.01)

(58) Field of Classification Search
None
See application file for complete search history.

(56) References Cited

U.S. PATENT DOCUMENTS

| 8,484,535 | B2 | 7/2013 | Graef et al. |
| 8,799,742 | B1 * | 8/2014 | Zhang ............. H03M 13/1142 714/759 |
| 10,534,665 | B2 | 1/2020 | Lin et al. |

(Continued)

FOREIGN PATENT DOCUMENTS

TW 201926347 A 7/2019

OTHER PUBLICATIONS

Y. Cai, S. Ghose, E. F. Haratsch, Y. Luo and O. Mutlu, "Error Characterization, Mitigation, and Recovery in Flash-Memory-Based Solid-State Drives," in Proceedings of the IEEE, vol. 105, No. 9, pp. 1666-1704, Sep. 2017, doi: 10.1109/JPROC.2017.2713127. (Year: 2017).*

*Primary Examiner* — Daniel F. McMahon
(74) *Attorney, Agent, or Firm* — McClure, Qualey & Rodack, LLP

(57) ABSTRACT

A flash memory controller used to access a flash memory includes a read-only memory, a processor, and an error correction code unit. The read-only memory is used to store a code. The processor executes the code to control access to the flash memory. The error correction code unit includes a control module and a decoder. The control module respectively calculates a first correlation between innate bad-column information which records the location of innate bad columns that become damaged after the read-only memory being manufactured and a plurality of trapping sets of a plurality of preset LDPC (low-density parity check) codes and uses the preset LDPC code which has the lowest first correlation as a selected LDPC code. The decoder decodes read information obtained from the flash memory according to the selected LDPC code.

23 Claims, 5 Drawing Sheets

(56) References Cited

U.S. PATENT DOCUMENTS

| | | | |
|---|---|---|---|
| 2009/0319860 A1* | 12/2009 | Sharon | H03M 13/1131 714/752 |
| 2012/0089883 A1* | 4/2012 | Li | H03M 13/116 714/752 |
| 2012/0331369 A1* | 12/2012 | Li | H03M 13/1142 714/758 |
| 2013/0086445 A1* | 4/2013 | Yedidia | H03M 13/1154 714/755 |
| 2015/0222291 A1 | 8/2015 | Kokubun et al. | |
| 2016/0179620 A1* | 6/2016 | Bazarsky | H03M 13/3707 714/766 |
| 2019/0163567 A1 | 5/2019 | Lin et al. | |

* cited by examiner

FLASH MEMORY CONTROLLER, STORAGE DEVICE AND READING METHOD THEREOF

CROSS REFERENCE TO RELATED APPLICATIONS

This Application claims priority of Taiwan Patent Application No. 108126704, filed on Jul. 29, 2019, the entirety of which is incorporated by reference herein.

BACKGROUND OF THE INVENTION

Field of the Invention

The present invention relates to an LDPC (low-density parity check) technology, and more particularly to a flash memory controller, a storage device and a reading method thereof that can prevent the weakness of the LDPC code from coinciding with the weakness of the flash memory, which can decrease correction ability and reliability.

Description of the Related Art

Flash memory can be electronically erased and written, or programmed, for data storage. It is therefore widely used in memory cards, solid state drives (SSDs), portable multimedia players, and so on. Furthermore, flash memory can be classified into a NOR-type flash memory or a NAND-type flash memory. NAND-type flash memory has a higher storage density and a lower cost per storage bit than NOR-type flash memory.

In general, flash memory may have bad columns before open-card operation due to manufacturing defects (these kinds of bad columns can be referred to as innate bad columns). Furthermore, during the operating process of the flash memory, certain columns may become weak because of the use of wear and then turn out to be bad columns for errors prone to appear here (these kinds of bad columns can be referred to as run-time bad columns). Moreover, high-reliability errors caused by these bad columns will influence correction ability and reliability of an LDPC (low-density parity check) code.

When encountering innate bad columns, a conventional flash memory controller may still use them directly if their condition is not too serious. If the flash memory controller has the ability to skip bad columns, they should be skipped directly by reducing the size of the page, for example. However, such a skipping operation will increase the processing complexity of the flash memory controller, and any reduction of the page-size will also decrease the correction ability of the LDPC code.

BRIEF SUMMARY OF THE INVENTION

In an embodiment, a flash memory controller used to access a flash memory includes a read-only memory, a processor and an error correction code unit. The read-only memory is configured to store a code. The processor is configured to execute the code to control access to the flash memory. The error correction code unit includes a control module and a decoder. The control module is configured to respectively calculate a first correlation between innate bad-column information and a plurality of trapping sets of a plurality of preset LDPC codes, and use the preset LDPC code which has the lowest first correlation as a selected LDPC code. Moreover, the decoder is configured to decode read information obtained from the flash memory according to the selected LDPC code.

In an embodiment, a storage device includes a flash memory and a flash memory controller. The flash memory controller is configured to access the flash memory. The flash memory controller includes a read-only memory, a processor and an error correction code unit. The read-only memory is configured to store a code. The processor is configured to execute the code to control access to the flash memory. The error correction code unit includes a control module and a decoder. The control module is configured to respectively calculate a first correlation between innate bad-column information and a plurality of trapping sets of a plurality of preset LDPC codes, and use the preset LDPC code which has the lowest first correlation as a selected LDPC code. Moreover, the decoder is configured to decode read information obtained from the flash memory according to the selected LDPC code.

In an embodiment, a reading method for a flash memory includes: respectively calculating a first correlation between innate bad-column information and a plurality of trapping sets of a plurality of preset LDPC codes; using the preset LDPC code which has the lowest first correlation as a selected LDPC code; obtaining read information from the flash memory according to a read instruction; and decoding the read information by using the selected LDPC code.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

In order to make the above objects, features and advantages of the embodiments of the present invention easier to understand, a detailed description is given in the following embodiments with reference to the accompanying drawings.

Figure 1:
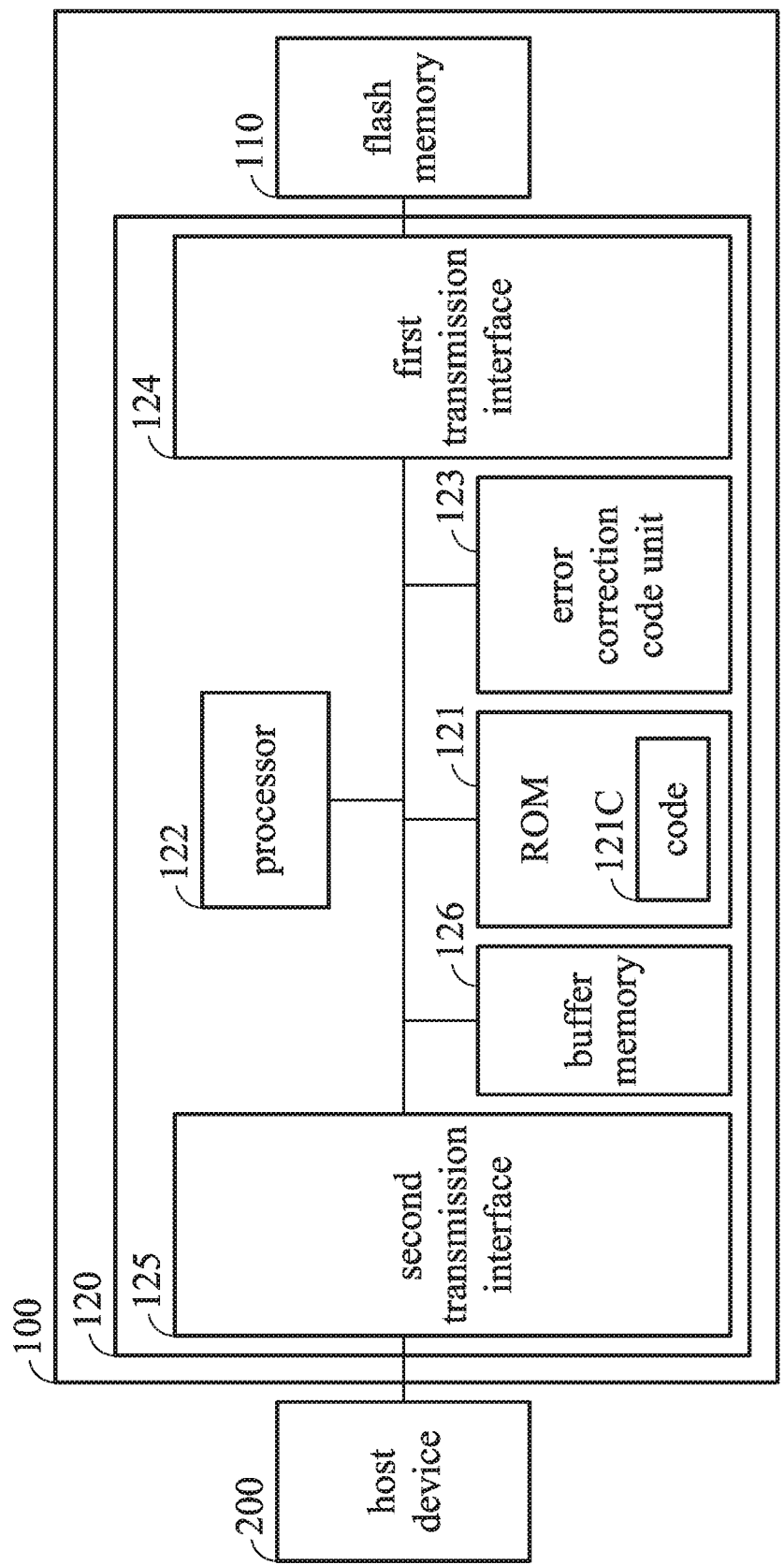
FIG. 1 is a block diagram illustrating an embodiment of a storage device coupled to a host device.

FIG. 1 is a block diagram illustrating an embodiment of a storage device coupled to a host device. Please refer to FIG. 1. A storage device 100 can be coupled to a host device 200. In some implementations, the storage device 100 may be a memory card, and the host device 200 may be any one of various devices that are configured with a card reader, such as a computer, a cell phone, or a camera, but it is not limited thereto. In other implementations, the storage device 100 may be a solid state drive (SSD), and the host device 200 may be a computer or a host computer, but it is not limited thereto.

In an embodiment, the storage device 100 includes a flash memory 110 and a flash memory controller 120, and the flash memory controller 120 is coupled to the flash memory 110. The flash memory 110 is configured to store various types of data, such as multimedia files, and the flash memory controller 120 can access the flash memory 110.

Figure 2:
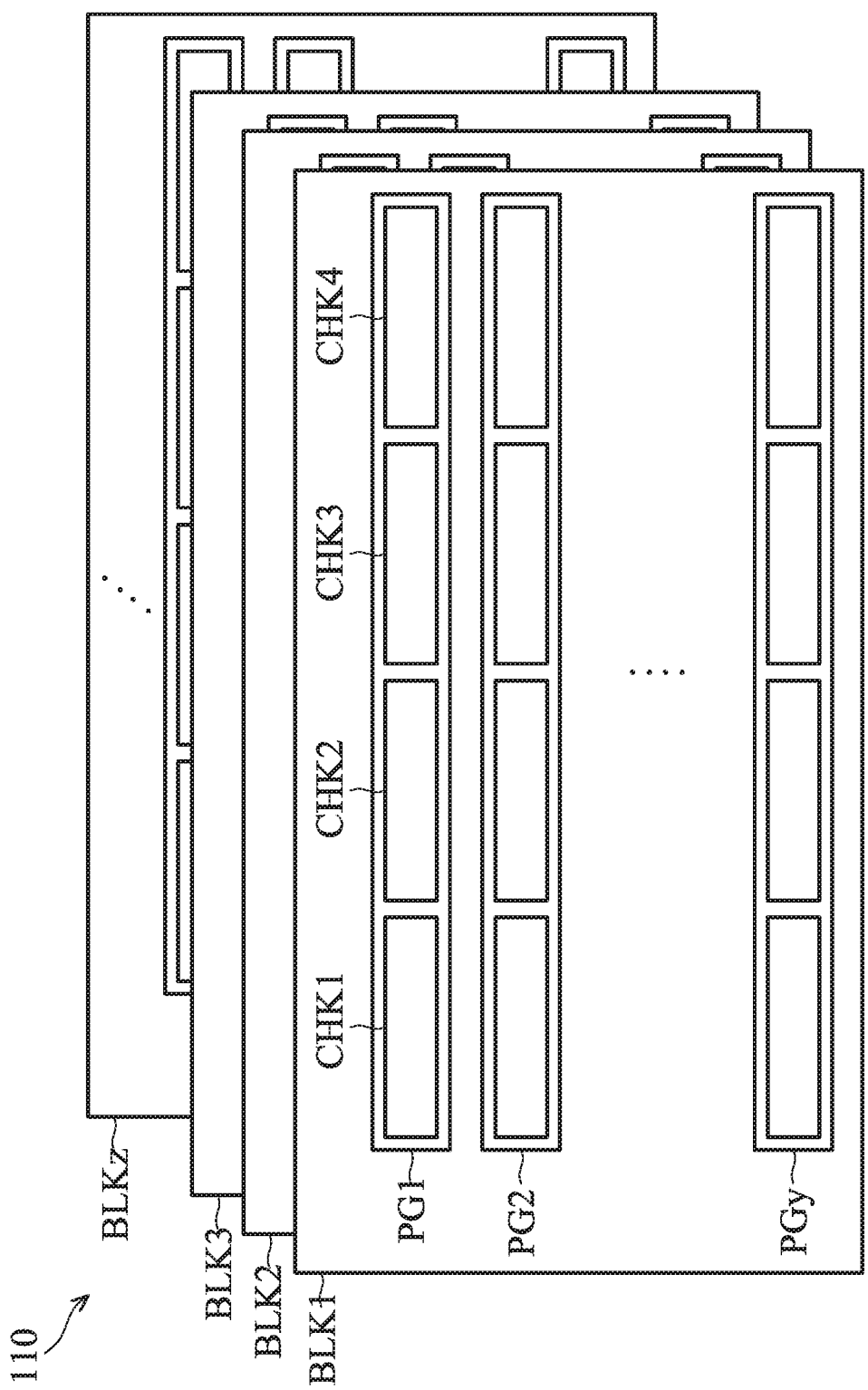
FIG. 2 is schematic diagram illustrating an embodiment of a data storage space of flash memory.

FIG. 2 is schematic diagram illustrating an embodiment of a data storage space of the flash memory. Please refer to FIG. 1 and FIG. 2. Generally, the data storage space in flash memory 110 can be divided into a plurality of blocks (or it can referred to as physical blocks) BLK1-BLKz, wherein z is a positive integer that is greater than one. Each of the blocks BLK1-BLKz includes a plurality of pages (also referred to as physical pages) PG1-PGy, wherein y is a positive integer that is greater than one. Furthermore, each of the pages PG1-PGy includes a plurality of chunks. In some implementations, y can be 256, and the size of the data area of each of the pages PG1-PGy can be 16 kilobytes (KB), and each of the pages PG1-PGy includes four chunks CH1-CH4 (herein, the size of the data area of each of the chunks CH1-CH4 is 4 KB), however, the present invention is not limited thereto.

In an embodiment, the flash memory controller 120 can include a read-only memory (ROM) 121, a processor 122 and an error correction code unit 123. Furthermore, the flash memory controller 120 may further include at least two transmission interfaces (hereinafter referred to as a first transmission interface 124 and a second transmission interface 125) and at least one buffer memory 126. Herein, the processor 122 is coupled to the read-only memory 121, the error correction code unit 123, the first transmission interface 124, the second transmission interface 125 and the buffer memory 126.

In some implementations, the processor 122 can be coupled to the read-only memory 121, the error correction code unit 123, the first transmission interface 124, the second transmission interface 125 and the buffer memory 126 via a bus. The first transmission interface 124 and the second transmission interface 125 can be a USB (Universal Serial Bus) interface, an ATA (Advanced Technology Attachment) interface, a SATA (Serial ATA) interface, a PCI-E (Peripheral Component Interconnect-Express) interface and so on. Furthermore, the processor 122 may be a CPU (Central Processing Unit), a micro-processor, a DSP (Digital Signal Processor), a PLD (Programmable Logic Device) or another similar circuit component, but the present invention is not limited thereto.

The read-only memory 121 can be used to store a code 121C. However, the present invention is not limited thereto. The code 121C can also be stored in the buffer memory 126 or another type of memory. The processor 122 can control the read-only memory 121, the error correction code unit 123, the first transmission interface 124, the second transmission interface 125, and the buffer memory 126 by executing the code 121C. For example, accessing the flash memory 110 through the first transmission interface 124 (especially the operation to access blocks BLK1-BLKz or pages PG1-PGy), uses the buffer memory 126 to perform the required buffer operation, communicate with the host device 200 which is coupled to the storage device 100 through the second transmission interface 125, use the error correction code unit 123 to perform encoding and decoding, and so on.

Figure 3:
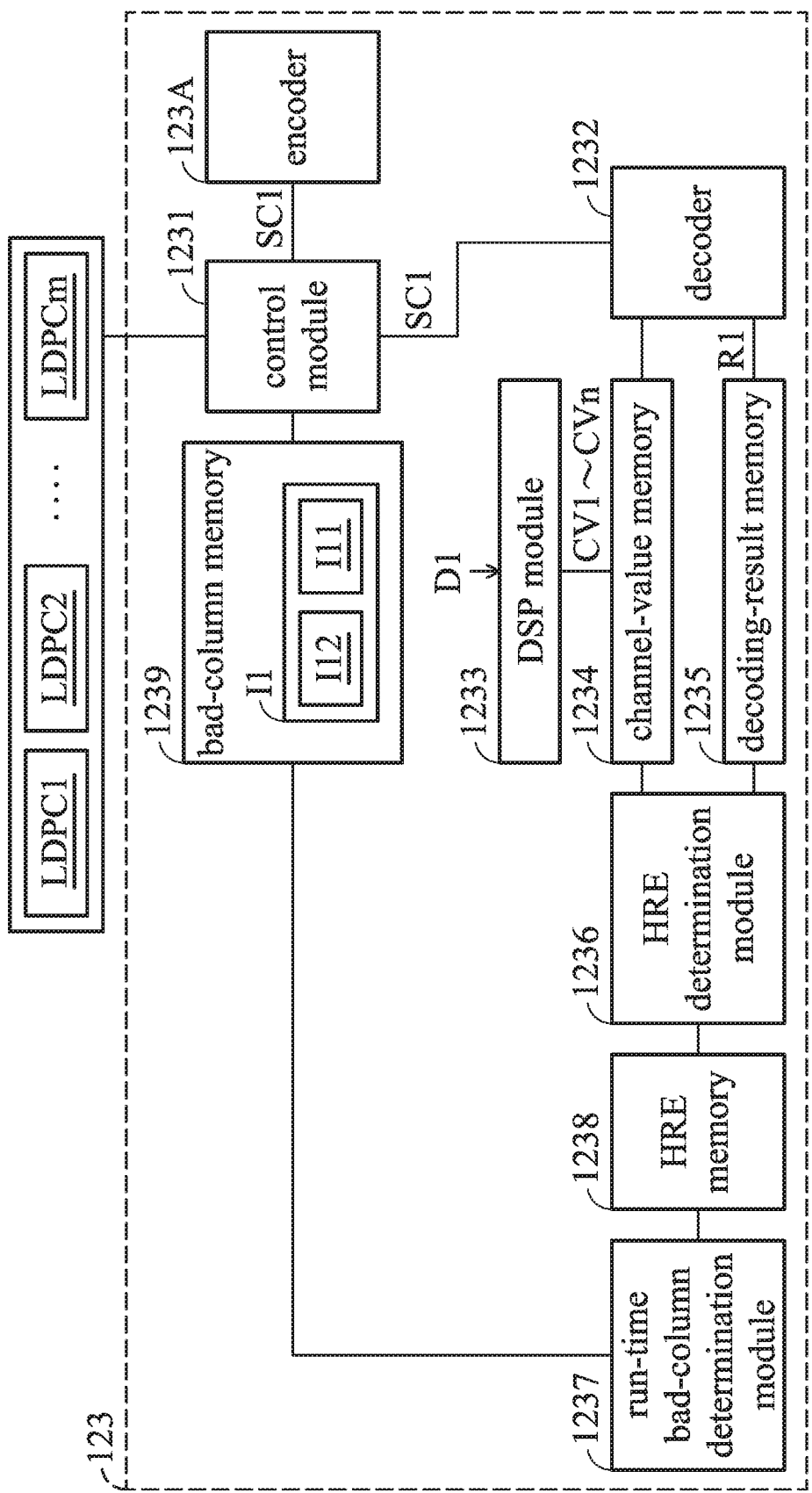
FIG. 3 is a block diagram illustrating an embodiment of error correction code unit in FIG. 1.

FIG. 3 is a block diagram illustrating an embodiment of the error correction code unit illustrated in FIG. 1. Please refer to all the figures from FIG. 1 to FIG. 3. The error correction code unit 123 can use an LDPC (low-density parity check) code to decode information read from the flash memory 110, and to encode information written into the flash memory 110. In an embodiment, the error correction code unit 123 may include a control module 1231 and a decoder 1232, and the control module 1231 is coupled to the decoder 1232.

In general, the manufacturer can perform an open-card operation on the storage device 100 during the manufacturing stage of the storage device 100. The open-card operation mainly includes system initialization and low-level formatting. After performing a system initialization, an information block that occupies part of the storage capacity of the flash memory 110 can be generated. Moreover, this information block can include innate bad-column information I11. Herein, the innate bad-column information I11 records the location of innate bad columns that become damaged after being manufactured.

In order to avoid the correction ability and the reliability of an LDPC code decreasing in the location of weakness (i.e., the location of trapping sets) of LDPC code in use coincides with the location of weakness (i.e., the location of bad columns) of the flash memory 110, the flash memory controller 120 of any embodiment of the present invention can read information stored in the flash memory 110 according to the reading method of any embodiment.

Figure 4:
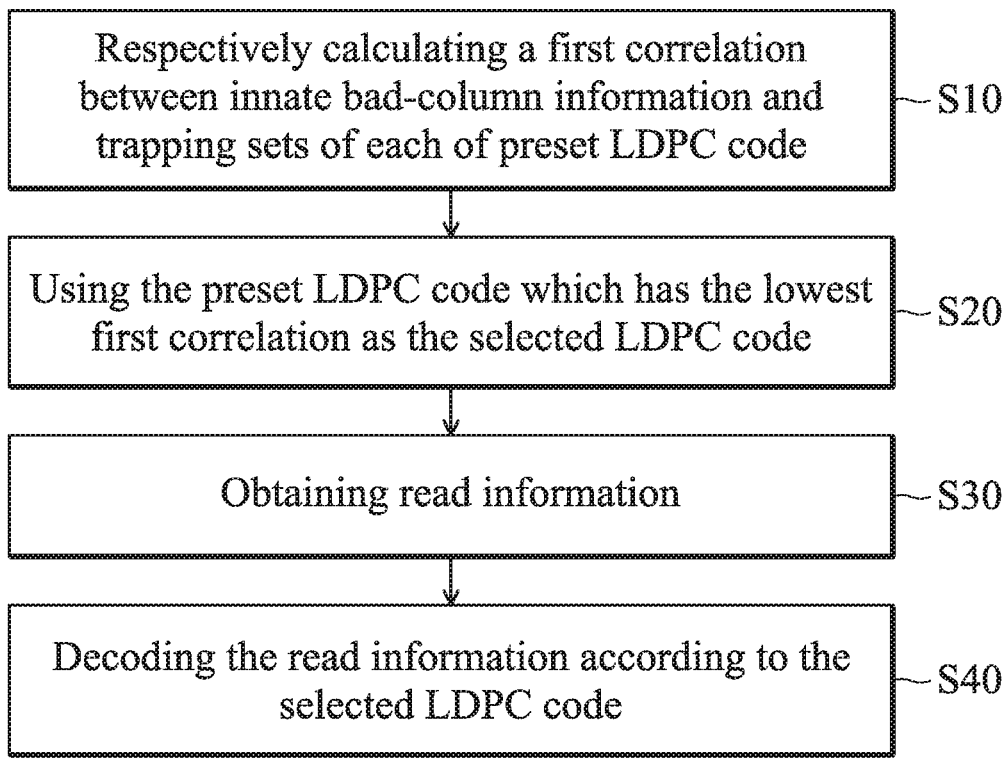
FIG. 4 is a flowchart illustrating an embodiment of the reading method.

FIG. 4 is a flowchart illustrating an embodiment of the reading method. Please refer to all the figures from FIG. 1 to FIG. 4. In an embodiment of the reading method, the flash memory controller 120 can obtain innate bad-column information I11 stored in the flash memory 110 through the first transmission interface 124. Then, the flash memory controller 120 uses the control module 1231 of the error correction code unit 123 to respectively calculate a first correlation between the innate bad-column information I11 and trapping sets of each preset LDPC code according to the plurality of trapping sets of the plurality of preset LDPC codes LDPC1-LDPCm and the innate bad-column information I11 (step S10), and the control module 1231 selects the preset LDPC code which has the lowest first correlation to be a selected LDPC code SC1 to provide to the decoder 1232 (step S20). Herein, the first correlation indicates how much the locations of the trapping sets of preset LDPC code are correlated to the locations of bad columns in the innate bad-column information I11. Moreover, a greater first correlation indicates that there is higher coincidence degree between the locations of the trapping sets of preset LDPC code and the locations of bad columns in the innate bad-column information I11.

When the flash memory controller 120 receives a read instruction from the host device 200 through the second transmission interface 125, the flash memory controller 120 can use the processor 122 to perform a read operation on specific physical address in one of the blocks BLK1-BLKz of the flash memory according to logical address recorded in the read instruction, so as to obtain read information D1 (step S30). Then, the flash memory controller 120 can use the decoder 1232 to decode the read information D1 through the selected LDPC code SC1, and to generate a corresponding decoding result R1 (step S40). Furthermore, the flash memory controller 120 may further use the processor 122 to transmit the decoding result R1 obtained in step S40 to the host device 200 through the second transmission interface, so as to finish the read operation indicated by the read instruction.

Herein, since the decoder 1232 performs decoding using the selected LDPC code SC1 which has the lowest first correlation with the innate bad-column information I11, the influence, caused by the innate bad columns, to the correction ability and the reliability of the selected LDPC code SC1 can be reduced effectively.

In an embodiment of step S10, the locations and types of the trapping sets possessed by each of the preset LDPC codes LDPC1-LDPCm may be different from each other. Herein, the locations and types of the trapping sets of each of the preset LDPC codes LDPC1-LDPCm can be found in advance. These preset LDPC codes LDPC1-LDPCm and their information such as the locations, types and so on of corresponding trapping sets can be stored in the read-only memory 121. However, the present invention is not limited thereto. These preset LDPC codes LDPC1-LDPCm and their information such as the locations, types and so on of corresponding trapping sets can also be stored in the flash memory 110, and the flash memory controller 120 can obtain them by accessing the flash memory 110. Therefore, after the control module 1231 obtains the innate bad-column information I11, the control module 1231 can compare the locations of trapping sets of each of the preset LDPC codes LDPC1-LDPCm with the locations of the bad columns recorded in the innate bad-column information I11 in sequence, so as to obtain the first correlation of each of the preset LDPC codes LDPC1-LDPCm.

Finding the locations and types of trapping sets possessed by each of the preset LDPC codes LDPC1-LDPCm is a skill that is well known to those with ordinary skill in the art. For example, a high-reliability error (EIRE) test or an importance sampling (IS) test, etc. may be used to find this out, and so it will not be described in detail.

In an embodiment of step S30, the error correction code unit 123 may further include a digital signal processing module (DSP module) 1233, and the digital signal processing module 1233 may be coupled to the decoder 1232. Herein, the flash memory controller 120 can use the processor 122 to read information D1 on specific physical address in a certain block according to the read instruction, and use the digital signal processing module 1233 of the error correction code unit 123 to calculate reliability messages on the specific physical address, so as to transform a plurality of channel values CV1-CVn corresponding to the read information D1. Each of the channel values CV1-CVn includes a sign bit and at least one reliability bit. Furthermore, the error correction code unit 123 may further include a channel-value memory 1234. The channel-value memory 1234 is coupled to the digital signal processing module 1233 and the decoder 1232, and the channel-value memory 1234 can be used to store these channel values CV1-CVn transformed by the digital signal processing module 1233.

In an embodiment of step S40, the error correction code unit 123 may further include a decoding-result memory 1235. The decoding-result memory 1235 is coupled to the decoder 1232, and the decoding-result memory 1235 can be used to store the decoding result R1 which is generated by the decoder 1232 and used in subsequent steps. Herein, Decoding the channel values CV1-CVn recursively by the selected LDPC code SC1 to generate the decoding result R1 is a skill that well known to those with ordinary skill in the art. For example by using a belief-propagation algorithm (BPA) or a sum-product algorithm, and therefore it will not be described in detail.

In general, due to the influence of manufacturing defects or process unevenness, certain columns of the flash memory 110 may wear out particularly quickly during the process of operating the storage device 100. Errors are therefore prone to appearing on bits of these columns. These error-prone columns are called run-time bad columns.

Figure 5:
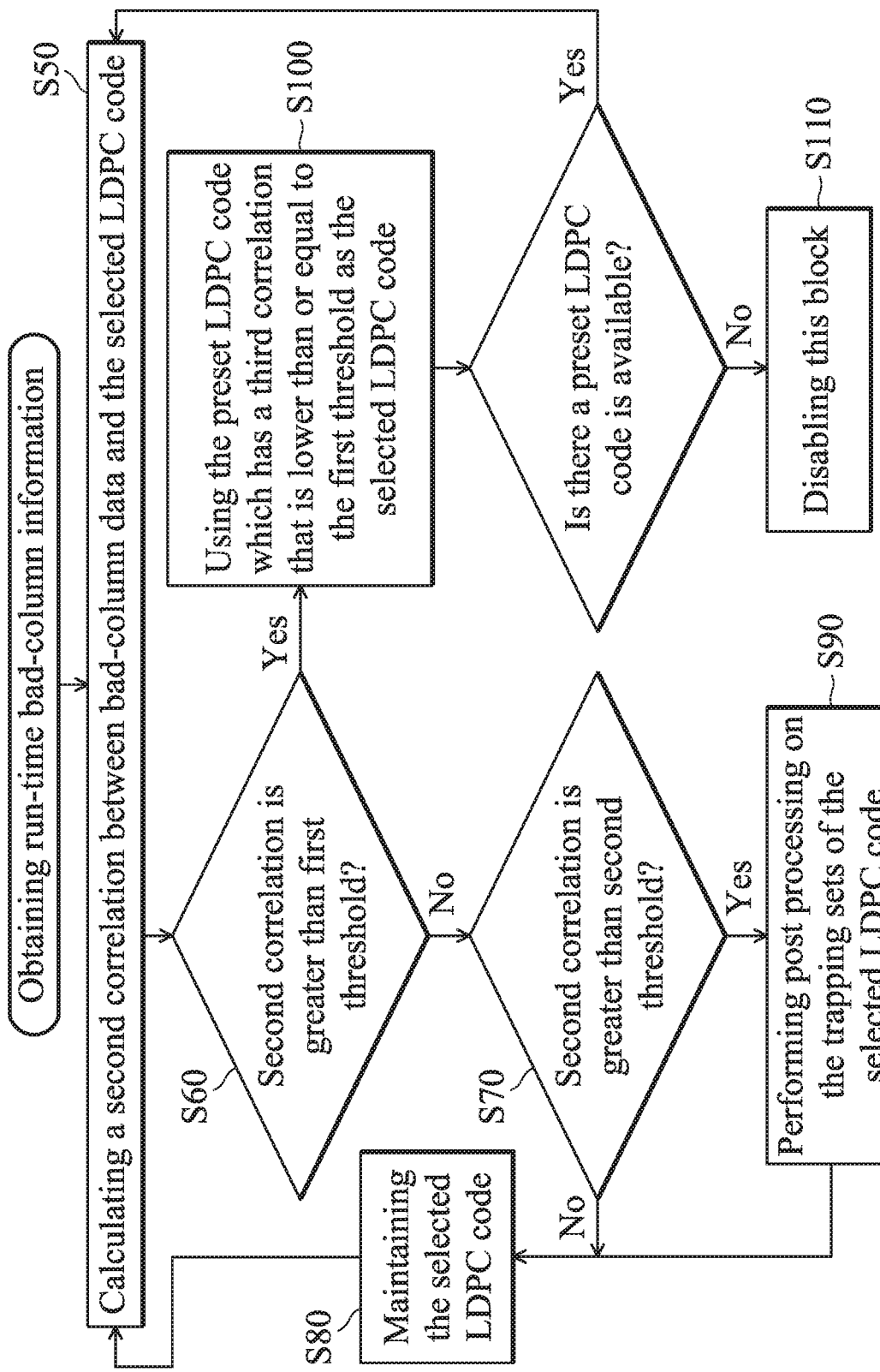
FIG. 5 is a flowchart illustrating an embodiment of the reading method after performing step S40 in FIG. 4.

FIG. 5 is a flowchart illustrating an embodiment of a reading method after performing step S40 in FIG. 4. Please refer to all the figures from FIG. 1 to FIG. 5. In an embodiment of the reading method, since run-time bad columns generated in the operating process will also influence the correction ability and the reliability of the selected LDPC code SC1, the flash memory controller 120 may further combine the innate bad-column information I11 with the run-time bad-column information I12 to create bad-column data I1 after obtaining the run-time bad-column information I12. Then, the flash memory controller 120 can use the control module 1231 of the error correction code unit 123 to calculate a second correlation between the bad-column data I1 and the trapping sets of preset LDPC which is used as the selected LDPC code SC1 currently (step S50). The second correlation indicates how much the locations of the trapping sets of selected LDPC code SC1 are correlated to the locations of bad columns in the bad-column data I1. Moreover, a greater second correlation indicates that there is higher coincidence degree between the locations of the trapping sets of selected LDPC code SC1 and the locations of bad columns in the bad-column data I1. After that, the control module 1231 can compare the second correlation obtained in step S50 with a first threshold which is predetermined, so as to determine whether the second correlation is greater than the first threshold (step S60).

In an embodiment of step S50, the error correction code unit 123 may further include a high-reliability error determination module (HRE determination module) 1236 and a run-time bad-column determination module 1237. The high-reliability error determination module 1236 is coupled to the channel-value memory 1234 and the decoding-result memory 1235, and the run-time bad-column determination module 1237 is coupled to the high-reliability error determination module 1236.

Herein, the high-reliability error determination module 1236 is configured to compare the decoding result R1 stored in the decoding-result memory 1235 with the channel values CV1-CVn stored in the channel-value memory 1234 in order, so as to respectively determine whether or not each of the channel values CV1-CVn is a high-reliability error. During the determination process of each of the channel values CV1-CVn, if a channel value is determined to be a high-reliability error, the high-reliability error determination module 1236 will generate high-reliability error information according to the address corresponding to this channel value, so as to record each location in the flash memory 110 that is determined to be a high-reliability error.

For example, it is assumed that the channel value CV1 indicates that corresponding bit data is a high reliability "0", while the decoding result R1 generated by the decoder 1232 indicates that this bit data should be "1", the high-reliability error determination module 1236 can determine that this is a high-reliability error and generate corresponding high-reliability error information. In some embodiments, the high-reliability error information can include a block number, a page number, a chunk number, an address, and so on for the high-reliability error.

In some embodiments, the error correction code unit 123 may further include a high-reliability error memory (HRE memory) 1238, and the high-reliability error memory 1238 is coupled to the high-reliability error determination module 1236 and the run-time bad-column determination module 1237. Herein, the high-reliability error determination module 1236 can store all the high-reliability error information it generates into the high-reliability error memory 1238. In some implementations, the high-reliability error determination module 1236 can store all of the generated high-reliability error information by constructing a table. For example, implementation of a bad-column table constructed by the high-reliability error determination module 1236 can be as shown in Table 1 below, wherein the fields of the bad-column table can include block number, page number, chunk number, address, and number of times.

TABLE 1

| Block Number | Page Number | Chunk Number | Address | Number Of Times |
|---|---|---|---|---|
| 17 | 22 | 0 | 0x056 | 3 |
| 17 | 22 | 0 | 0x075 | 2 |
| 17 | 22 | 0 | 0x1A2 | 3 |
| 17 | 22 | 0 | 0x2D3 | 0 |

Herein, each time the high-reliability error determination module 1236 generates a high-reliability error, the high-reliability error determination module 1236 can first determine whether the location in the high-reliability error information is identical to the location in a certain high-reliability error information which was generated previously (i.e., whether block number, page number, chunk number and address in this high-reliability error information are identical to block number, page number, chunk number and address recorded in a certain row of the bad-column table). If identical, the high-reliability error determination module 1236 can increment the value by one in the field "Number Of Times" of the row that is identical to the location of the high-reliability error information in the bad-column table. Conversely, if the locations are not identical or the location has not appeared before, the high-reliability error determination module 1236 can record the location of this high-reliability error information into a new row in the bad-column table.

The run-time bad-column determination module 1237 is used to determine whether a run-time bad column appears in the flash memory 110 according to all the high-reliability error information stored in the high-reliability error memory 1238 (i.e., the bad-column table constructed by the high-reliability error determination module 1236). Moreover, when determining that a run-time bad column appears, the run-time bad-column determination module 1237 can record the location of this run-time bad column into the run-time bad-column information I12 of the bad-column data I1.

In some embodiments, the run-time bad-column determination module 1237 can determine whether a run-time bad column appears in the flash memory 110 according to the amount of high-reliability error location information in an identical location is greater than first predetermined amount. For example, the run-time bad-column determination module 1237 can determine whether the value in the field "Number Of Times" of each row in the bad-column table is greater than the first predetermined amount. At this time, if the value in the field "Number Of Times" in a certain row is greater than the first predetermined amount, the run-time bad-column determination module 1237 can determine that a run-time bad column appears and record the address of the field "Address" in this row into the run-time bad-column information I12. The value of the first predetermined amount depends on the design.

In other embodiments, the run-time bad-column determination module 1237 can also determine whether the amount of high-reliability error location information that across pages but remaining locations are identical is greater than second predetermined amount. For example, it is assumed that if the content of many rows in the bad-column table differs only in the field of "Page Number", the run-time bad-column determination module 1237 can calculate the number of these rows. When the number of these rows is greater than the second predetermined amount, the run-time bad-column determination module 1237 can determine that a run-time bad column appears and record the address of the field "Address" in these rows into the run-time bad-column information I12. The value of the second predetermined amount depends on the design.

In other embodiments, the run-time bad-column determination module 1237 may simultaneously determine whether the value in the field "Number Of Times" of each row in the bad-column table is greater than the first predetermined amount, and whether the amount of high-reliability error location information that they are only different in page number is greater than second predetermined amount.

In some embodiments, the error correction code unit 123 may further include a bad-column memory 1239, and the bad-column memory 1239 may be coupled to the run-time bad-column determination module 1237 and the control module 1231. The bad-column memory 1239 is used to store the bad-column data I1. The bad-column data I1 includes the innate bad-column information I11 and the run-time bad-column information I12, and the content of the run-time bad-column information I12 can be newly added by the run-time bad-column determination module 1237.

In an embodiment of the reading method, when the control module 1231 has determined that the second correlation is lower than or equal to the first threshold in step S60, it indicates that the coincidence degree between the locations of the trapping sets of selected LDPC code SC1 and the locations of the bad columns in bad-column data I1 does not exceed the standard, and the control module 1231 can maintain the selected LDPC code SC1 which is used currently and return to step S50, so as to continuously monitor the second correlation between the selected LDPC code SC1 and the bad-column data I1. However, the present invention is not limited thereto. In another embodiment, the control module 1231 may further compare the second correlation with a second threshold which is smaller than the first threshold, so as to determine whether the second correlation is greater than the second threshold (step S70).

When the determination result in step S70 is that the second correlation is lower than or equal to the second threshold, it indicates that the coincidence degree between the locations of the trapping sets of selected LDPC code SC1 and the locations of the bad columns in bad-column data I1 is lower enough, therefore, the control module 1231 can maintain the selected LDPC code SC1 which is used currently (step S80). Conversely, when the determination result in step S70 is that the second correlation is greater than the second threshold, it indicates that although the coincidence degree between the locations of the trapping sets of selected LDPC code SC1 and the locations of the bad columns in bad-column data I1 is insufficient to seriously decrease the correction ability and the reliability of the selected LDPC code SC1, it still may cause some reduction of the correction ability and the reliability of the selected LDPC code SC1. At this time, the control module 1231 can enable the decoder 1232 to perform post processing on the trapping sets of selected LDPC code SC1 in an attempt to reduce the error floor of the selected LDPC code SC1 (step S90). Moreover, after performing the post processing, the control module 1231 can return to step S80 to maintain the selected LDPC code SC1 which has passed post processing.

Herein, the selections of the first threshold and the second threshold depend on the design requirements. In some implementations, the first threshold can be 0.5, and the second threshold can be 0.3.

In an embodiment of the reading method, when the control module 1231 determines that the second correlation is greater than the first threshold in step S60, it indicates that the coincidence degree between the locations of the trapping sets of selected LDPC code SC1 and the locations of the bad columns in bad-column data I1 is too high. At this time, the control module 1231 can change to use a certain preset LDPC code in the plurality of preset LDPC codes LDPC1-LDPCm as the selected LDPC code SC1, wherein a third correlation between this certain preset LDPC code with the bad-column data I1 is lower than or equal to the first threshold, and provide the selected LDPC code SC1 which has updated to the decoder 1232 (step S100), so that the decoder 1232 can perform decoding according to the selected LDPC code SC1 which has updated. The third correlation indicates how much the locations of the trapping sets of preset LDPC code are correlated to the locations of bad columns in the bad-column data I1. Moreover, a greater the third correlation indicates that there is higher coincidence degree between the locations of the trapping sets of preset LDPC code and the locations of bad columns in the bad-column data I1.

In an embodiment of step S100, the control module 1231 can obtain one preset LDPC code from the plurality of preset LDPC codes LDPC1-LDPCm, and then calculate a third correlation between the trapping sets of this preset LDPC code and the bad-column data I1. When the obtained third correlation is lower than or equal to the first threshold, the control module 1231 can use this preset LDPC code as a new selected LDPC code SC1 and return to step S50 for continuous monitoring. However, when the obtained third correlation is greater than the first threshold, the control module 1231 will obtain another preset LDPC code from the plurality of preset LDPC codes LDPC1-LDPCm and then perform a calculation. The control module 1231 will continue check a third correlation of another preset LDPC code if a third correlation of the preset LDPC code in check still greater than the first threshold until all of the preset LDPC codes LDPC1-LDPCm have been checked.

In an embodiment of the reading method, if the control module 1231 cannot find any preset LDPC code that has a third correlation that is lower than or equal to the first threshold among the plurality of preset LDPC codes LDPC1-LDPCm, it indicates that this block (i.e., the block that corresponds to the bad-column data I1) is not applicable anymore. At this time, the control module 1231 can store the block number of this block into a bad-block list to prohibit the use of this block (step S110). In some embodiments, the bad-block list can be stored in the flash memory 110.

In some embodiments, the error correction code unit 123 may further include an encoder 123A, and the encoder 123A may be coupled to the control module 1231. Herein, the encoder 123A can encode write data written to the flash memory 110 according to the selected LDPC code SC1 indicated by the control module 1231.

In some embodiments, the control module 1231 can select the corresponding selected LDPC code SC1 to each block according to the situation of bad columns of each block in the bad-column data I1. In this way, the decoder 1232 can use the corresponding selected LDPC code SC1, according to the block source of the current channel values CV1-CVn, to perform decoding (the same applies to the encoder 123A).

In some embodiments, the "module" and the "unit" in the present invention, such as the error correction code unit 123, the control module 1231, the digital signal processing module 1233, the high-reliability error determination module 1236, the run-time bad-column determination module 1237, and so on can be realized by an ASIC (Application-specific integrated circuit). Furthermore, the processor 122 can be a CPU, a micro-processor, a DSP, a PLC (Programmable Logic Controller), an ASIC, a PLD or another similar circuit component, but the present invention is not limited thereto.

In some embodiments, any one embodiment of the flash memory controller 120 can be integrated in a chip by a plurality of integrated circuit manufacturing methods, but the present invention is not limited thereto.

As described above, any one embodiment of the present invention provides a flash memory controller, a storage device and a reading method that uses the preset LDPC code which has the lowest correlation with the location of the innate bad columns of the flash memory as the selected LDPC code provided to the decoder for use, so that the influence caused by the innate bad columns of the flash memory to the correction ability and the reliability of the selected LDPC code can be reduced. Furthermore, any one embodiment of the present invention provides a flash memory controller, a storage device, and a reading method that further obtains the run-time bad-column information by detecting the location of the high-reliability errors during the operating process, so as to avoid the run-time bad columns that appear after use and that decrease the correction ability and the reliability of the selected LDPC code.

The features of the embodiments described above will allow persons having ordinary skill in the art to clearly appreciate the form of the present specification. Persons having ordinary skill in the art will appreciate that the objectives and/or the advantages of the above embodiments can be accomplished in a way that is consistent with the above embodiments by designing or modifying other processes and structures based on the content of the present disclosure. Persons having ordinary skill in the art will also appreciate that equivalent constructions can be modified, substituted or retouched without departing from the scope and spirit of the present invention.

What is claimed is:

1. A flash memory controller, configured to access a flash memory, wherein the flash memory controller comprises:
   a read-only memory, configured to store a code;
   a processor, configured to execute the code to control access to the flash memory; and
   an error correction code unit, comprising:
   a control module, respectively calculating a first correlation between innate bad-column information which records the location of innate bad columns that become damaged after the read-only memory being manufactured and a plurality of trapping sets of each of a plurality of preset LDPC (low-density parity check) codes, and using the preset LDPC code which has the lowest first correlation among the plurality of preset LDPC codes as a selected LDPC code; and
   a decoder, decoding read information obtained from the flash memory according to the selected LDPC code.

2. The flash memory controller as claimed in claim 1, wherein the control module further calculates a second correlation between bad-column data and the trapping sets of the selected LDPC code, and determines whether the second correlation is greater than a first threshold, wherein the bad-column data comprises run-time bad-column information and the innate bad-column information, and when the second correlation is greater than the first threshold, the control module further uses the preset LDPC code which has a third correlation that is lower than or equal to the first threshold as the selected LDPC code, wherein the third correlation is a correlation between the preset LDPC code and the bad-column data.

3. The flash memory controller as claimed in claim 2, wherein the decoder generates a decoding result after decoding a plurality of channel values of the read information, and the error correction code unit further comprises:
   a high-reliability error determination module, configured to respectively determine whether each of the channel values is a high-reliability error according to the decoding result, and generate high-reliability error information when determining that the channel value is a high-reliability error; and
   a run-time bad-column determination module, configured to determine whether a run-time bad column appears in the flash memory according to all the high-reliability error information, and record a column location of the run-time bad column into the run-time bad-column information when determining that the run-time bad column appears.

4. The flash memory controller as claimed in claim 2, wherein when the second correlation is lower than the first threshold, the control module further determines whether the second correlation is greater than a second threshold, wherein when determining that the second correlation is greater than the second threshold, the control module enables the decoder to perform post processing on the trapping sets of the selected LDPC code, and when the second correlation is lower than or equal to the second threshold, the control module maintains the selected LDPC code.

5. The flash memory controller as claimed in claim 3, wherein when the control module cannot find out any of the preset LDPC codes that has a third correlation that is lower than or equal to the first threshold among the plurality of the preset LDPC codes as the selected LDPC code, the control module records a block number of a block corresponding to the bad-column data into a bad-block list to disable the block.

6. The flash memory controller as claimed in claim 3, wherein the run-time bad-column determination module determines that the run-time bad column appears when the amount of high-reliability error information having an identical location is greater than a first predetermined amount, or the run-time bad-column determination module determines that the run-time bad column appears when the amount of high-reliability error information that are only different in page number is greater than a second predetermined amount.

7. The flash memory controller as claimed in claim 3, wherein the error correction code unit further comprises:
   a digital signal processing module, configured to transform the read information read from the flash memory into the plurality of channel values;
   a channel-value memory, configured to store the plurality of channel values;
   a decoding-result memory, configured to store the decoding result;
   a high-reliability error memory, configured to store all the high-reliability error information generated by the high-reliability error determination module; and
   a bad-column memory, configured to store the bad-column data.

8. The flash memory controller as claimed in claim 1, wherein the plurality of preset LDPC codes is stored in the read-only memory.

9. A storage device, comprising:
   a flash memory; and
   a flash memory controller, configured to access the flash memory, wherein the flash memory controller comprises:
      a read-only memory, configured to store a code;
      a processor, configured to execute the code to control access to the flash memory; and
      an error correction code unit, comprising:
         a control module, respectively calculating a first correlation between innate bad-column information which records the location of innate bad columns that become damaged after the read-only memory being manufactured and a plurality of trapping sets of each of a plurality of preset LDPC codes, and using the preset LDPC code which has the lowest first correlation among the plurality of preset LDPC codes as a selected LDPC code; and
         a decoder, decoding read information obtained from the flash memory according to the selected LDPC code.

10. The storage device as claimed in claim 9, wherein the control module further calculates a second correlation between bad-column data and the trapping sets of the selected LDPC code, and determines whether the second correlation is greater than a first threshold, wherein the bad-column data comprises run-time bad-column information and the innate bad-column information, and when the second correlation is greater than the first threshold, the control module further uses the preset LDPC code which has a third correlation that is lower than or equal to the first threshold as the selected LDPC code, wherein the third correlation is a correlation between the preset LDPC code and the bad-column data.

11. The storage device as claimed in claim 10, wherein the decoder generates a decoding result after decoding a plurality of channel values of the read information, and the error correction code unit further comprises:
   a high-reliability error determination module, configured to respectively determine whether each of the channel values is a high-reliability error according to the decoding result, and generate high-reliability error information when determining that the channel value is the high-reliability error; and
   a run-time bad-column determination module, configured to determine whether a run-time bad column appears in the flash memory according to all the high-reliability error information, and record a column location of the run-time bad column into the run-time bad-column information when determining that the run-time bad column appears.

12. The storage device as claimed in claim 10, wherein when the second correlation is lower than the first threshold, the control module further determines whether the second correlation is greater than a second threshold, wherein when determining that the second correlation is greater than the second threshold, the control module enables the decoder to perform post processing on the trapping sets of the selected LDPC code, and when the second correlation is lower than or equal to the second threshold, the control module maintains the selected LDPC code.

13. The storage device as claimed in claim 10, wherein when the control module cannot find out any of the preset LDPC codes that has a third correlation that is lower than or equal to the first threshold among the plurality of the preset LDPC codes as the selected LDPC code, the control module records a block number of a block corresponding to the bad-column data into a bad-block list to disable the block.

14. The storage device as claimed in claim 11, wherein the run-time bad-column determination module determines that the run-time bad column appears when the amount of high-reliability error information having an identical location is greater than a first predetermined amount, or the run-time bad-column determination module determines that the run-time bad column appears when the amount of high-reliability error information that are only different in page number is greater than a second predetermined amount.

15. The storage device as claimed in claim 11, wherein the error correction code unit further comprises:
   a digital signal processing module, configured to transform the read information read from the flash memory into the plurality of channel values;
   a channel-value memory, configured to store the plurality of channel values;
   a decoding-result memory, configured to store the decoding result;
   a high-reliability error memory, configured to store all the high-reliability error information generated by the high-reliability error determination module; and
   a bad-column memory, configured to store the bad-column data.

16. The storage device as claimed in claim 9, wherein the plurality of preset LDPC codes is stored in the read-only memory.

17. A reading method for a flash memory having a memory controller and a decoder, comprising:
   by the memory controller, respectively calculating a first correlation between innate bad-column information which records the location of innate bad columns that become damaged after the read-only memory being manufactured and a plurality of trapping sets of each of a plurality of preset LDPC codes;
   by the memory controller, using the preset LDPC code which has the lowest first correlation among the plurality of preset LDPC codes as a selected LDPC code;
   by the decoder, obtaining read information from the flash memory according to a read instruction; and
   by the decoder, decoding the read information by using the selected LDPC code.

18. The reading method as claimed in claim 17, further comprising:
   calculating a second correlation between bad-column data and the trapping sets of the selected LDPC code, wherein the bad-column data comprises run-time bad-column information and the innate bad-column information;
   determining whether the second correlation is greater than a first threshold; and
   when the second correlation is greater than the first threshold, using the preset LDPC code which has a third correlation that is lower than or equal to the first threshold as the selected LDPC code, wherein the third correlation is a correlation between the preset LDPC code and the bad-column data.

19. The reading method as claimed in claim 18, wherein a decoding result is generated after decoding a plurality of channel values of the read information, and the reading method further comprises:
   respectively determining whether each of the channel values is a high-reliability error according to the decoding result;
   when determining that the channel value is the high-reliability error, generating high-reliability error information;
   determining whether a run-time bad column appears in the flash memory according to all the high-reliability error information; and
   when determining that the run-time bad column appears, recording a column location of the run-time bad column into the run-time bad-column information.

20. The reading method as claimed in claim 18, further comprising:
   when the second correlation is lower than the first threshold, determining whether the second correlation is greater than a second threshold;
   when determining that the second correlation is greater than the second threshold, performing post processing on the trapping sets of the selected LDPC code; and
   when determining that the second correlation is lower than or equal to the second threshold, maintaining the selected LDPC code.

21. The reading method as claimed in claim 18, further comprising:
   when cannot find out any of the preset LDPC codes that has a third correlation that is lower than or equal to the first threshold among the plurality of the preset LDPC codes as the selected LDPC code, recording a block number of a block corresponding to the bad-column data into a bad-block list to disable the block.

22. The reading method as claimed in claim 19, wherein the step of determining whether the run-time bad column appears is determined according to whether the amount of high-reliability error information in an identical location is greater than a first predetermined amount, or according to whether the amount of high-reliability error information that they are only different in page number is greater than a second predetermined amount.

23. The reading method as claimed in claim 17, wherein the step of obtaining the read information from the flash memory comprises:
   reading the read information from one of a plurality of blocks of the flash memory according to the read instruction; and
   transforming the read information into a plurality of channel values.

* * * * *